(12) United States Patent
Shih

(10) Patent No.: US 7,544,580 B2
(45) Date of Patent: Jun. 9, 2009

(54) METHOD FOR MANUFACTURING PASSIVE COMPONENTS

(75) Inventor: Hung-Lin Shih, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 69 days.

(21) Appl. No.: 11/614,994

(22) Filed: Dec. 22, 2006

(65) Prior Publication Data

US 2008/0153244 A1  Jun. 26, 2008

(51) Int. Cl.
*H01L 21/20* (2006.01)

(52) U.S. Cl. .................. 438/393; 438/381; 438/394; 438/395; 438/396; 438/397; 438/398; 438/399; 257/E21.008; 257/E21.022; 257/E29.343

(58) Field of Classification Search .......... 438/381, 438/393–399; 257/E21.008, E21.02, E29.343
See application file for complete search history.

(56) References Cited

U.S. PATENT DOCUMENTS

2002/0024118 A1* 2/2002 Okoshi et al. ............. 257/649
2003/0203709 A1* 10/2003 Peng et al. ................. 451/57
2006/0092366 A1* 5/2006 Inoue et al. ................ 349/143
2007/0049032 A1* 3/2007 Abatchev et al. .......... 438/691
2007/0122992 A1* 5/2007 Mizuno et al. ............. 438/396
2007/0158848 A1* 7/2007 Matsumoto et al. ........ 257/758
2008/0079127 A1* 4/2008 Gerber ....................... 257/676

* cited by examiner

*Primary Examiner*—Fernando L Toledo
*Assistant Examiner*—Jae Lee
(74) *Attorney, Agent, or Firm*—Winston Hsu

(57) ABSTRACT

A method for manufacturing passive components is disclosed. First, a substrate is provided, and a connecting region, a capacitor region and an inductance region are defined in the substrate. The substrate includes a first metal layer and an insulating layer on the first metal layer. Subsequently, the insulating layer is etched, and then the first metal layer is etched. Thus, an outer connecting pad in the connecting region and a bottom electrode in the capacitor region are formed simultaneously, and a part of the insulating layer on the bottom electrode remains. Thereafter, a dielectric layer is deposited, and then a dual damascene copper process is performed to form an inductance structure and a top electrode of a capacitor in the dielectric layer simultaneously. Next, a passive layer is deposited and an etching process is thereafter performed to expose the outer connecting pad.

24 Claims, 14 Drawing Sheets

METHOD FOR MANUFACTURING PASSIVE COMPONENTS

BACKGROUND OF THE INVENTION

1. Field of the Invention

The present invention relates to a method for manufacturing passive components, and more particularly, to a method of integrating the manufacturing processes of passive components.

2. Description of the Prior Art

Recently, the integrated circuit (IC) industry has developed continuously and flourishingly. The IC products, such as memory chips and central processing unit (CPU) chips that are popular from the early stage and communication chips that are popular and widely utilized in the age of mobile communication, are all developed toward powerful functions, low price, and small size. In other words, the integration process of passive components, such as the capacitors or the inductances in the chip, becomes a great challenge for circuit designs. Traditionally, when interconnects of an integrated circuit are manufactured, the needed inductance structures or capacitor structures are formed simultaneously according to the circuit design. In the light of the manufacturing process, the designed metal pattern is first transferred to a metal layer by utilizing the lithographic process, and the needed passive components and interconnects are manufactured subsequently by utilizing the processes, such as an etching process and a photoresist striping process.

Please refer to FIG. 1 through FIG. 7. FIG. 1 through FIG. 7 are schematic diagrams illustrating a method for forming a capacitor 36, an inductance structure 12 and an outer connecting pad 52 in a semiconductor wafer 30 according to the prior art. As shown in FIG. 1, a semiconductor wafer 30 is provided first. The semiconductor wafer 30 includes a substrate 10, and a first dielectric layer 14 covering the substrate 10. It should be noted that the semiconductor wafer 30 includes an inner core circuit (the full view of the inner core circuit is not shown in the figures), which includes a plurality of transistor components, a plurality of resistance components, a plurality of interconnects etc., so as to electrically connect to the follow-up capacitor structure, the follow-up inductance structure, the follow-up outer connecting pad and other components in the semiconductor wafer 30. However, the detailed connection of the inner core circuit depends on the chip design, and is not described in detail here. Subsequently, an inductance pattern opening 22 and a plug hole 66 are formed in the first dielectric later 14 by utilizing an etching process. As shown in FIG. 2, a copper layer is thereafter formed to fill the inductance pattern opening 22 and the plug hole 66. The filling copper layer in the inductance pattern opening 22 becomes an inductance structure 12, and the inductance structure 12 is electrically connected to the interconnect of the substrates 10 below. The filling copper layer in the plug hole 66 becomes a plug 17, and the plug 17 is a part of the interconnect of the semiconductor wafer 30.

Next, as shown in FIG. 3, an isolation layer 16 is formed on a surface of the wafer 10. The isolation layer 16, being a silicon nitride layer, covers the inductance structure 12 to prevent copper atoms in the inductance structure 12 from diffusing upwards. A first conductive layer 18 is thereafter formed on a surface of the isolation layer 16. The first conductive layer 18 comprises a tantalum nitride layer (TaN layer) or a titanium nitride layer (TiN layer), and the first conductive layer 18 is formed by a sputtering process. After that, a first patterned photoresist layer 24 is formed on the first conductive layer 18 by utilizing a coating process and a photolithography process to define a bottom electrode pattern.

As shown in FIG. 4, an etching process is furthermore performed to etch the first conductive layer 18 until reaching the surface of the isolation layer 16, by utilizing the first patterned photoresist layer 24 as an etching mask, to form a bottom electrode 26 of capacitor. After that, as shown in FIG. 5, a deposition process is performed after removing the first patterned photoresist layer 24 to form an insulating layer 28 on the surface of the wafer 10. The insulating layer 28 includes a silicon oxide layer or a silicon nitride layer, and the insulating layer 28 covers the bottom electrode 26. A second conductive layer 32 is next formed on a surface of the insulating layer 28. The second conductive layer 32 includes a tantalum nitride layer or a titanium nitride layer, and the second conductive layer 32 is formed by another sputtering process. A second patterned photoresist layer 34 is thereafter formed on the second conductive layer 32 to define a top electrode pattern.

As shown in FIG. 6, another etching process is next performed to etch the second conductive layer 32 and the insulating layer 28 until reaching the surface of the first conductive layer 18, by utilizing the second patterned photoresist layer 34 as an etching mask, to form a top electrode 38 and a capacitor dielectric layer 42 of the capacitor 36. The fabrication of the capacitor 36 is thus completed. As shown in FIG. 7, another deposition process is thereafter performed, after removing the second patterned photoresist layer 34, to form a second dielectric layer 44 on the surface of the wafer 10. The second dielectric layer 44 covers the capacitor 36. After that, an interconnecting process is performed to form a plug 46 in the second dielectric layer 44. Next, an outer connecting pad 52 is formed on the plug 46 by utilizing the processes, such as a sputtering process and an etching process. The outer connecting pad 52 is usually an aluminum pad (Al pad), which is electrically connecting to some components of the semiconductor wafer 30 through the interconnects of the semiconductor wafer 30, used for electrically connecting to an external device. It is worthy of note that the inductance structure 12, the capacitor 36, the plugs 17, 46 and other components in the semiconductor wafer 30 that are manufactured before the outer connecting pad 52 are all parts of the inner core circuit in the semiconductor wafer 30.

The prior art method of forming the passive components requires at least four photo masks to define the shape of the capacitor, the shape of the inductance and the position of the outer connecting pad. That means, at least four photolithography processes and at least four etching processes are required, making the processing very long. The cost is thus raised. In addition, the yield is sometimes decreased due to complex process steps used to affect the performance of the formed chip. The top electrode and the bottom electrode of the capacitor might even get higher resistance due to the prior art method of manufacturing the passive components, and cause the quality factor (Q factor) of the capacitor to decrease.

SUMMARY OF THE INVENTION

It is therefore a primary objective of the present invention to provide a method for manufacturing passive components to simplify the complex manufacturing processes of passive components.

According to the present invention, a method for fabricating passive components is disclosed. First, a substrate is provided. At least a connecting region, at least a capacitor region and at least an inductance region are defined in the substrate, and the substrate comprises a first metal layer and an insulating layer on the first metal layer. Subsequently, a first etching process is performed on the insulating layer so as to remove the insulating layer positioned in the connecting region, the insulating layer positioned in the inductance region and a part of the insulating layer positioned in the capacitor region, and to retain a part of the insulating layer positioned in the capacitor region. Next, a second etching process is performed on the first metal layer so as to form at least an outer connecting pad in the connecting region and form a bottom electrode below the insulating layer positioned in the capacitor region. Furthermore, a dielectric layer is deposited on the substrate. Next, a third etching process is performed on the dielectric layer so as to form an inductance pattern opening in the inductance region and form a top electrode opening in the capacitor region above the bottom electrode. Following that, the inductance pattern opening and the top electrode opening are filled with a second metal layer so as to form an inductance structure and a top electrode. The top electrode and the bottom electrode form a capacitor structure. Thereafter, a passive layer is deposited and a fourth etching process is next performed to expose the outer connecting pad.

From one aspect of the present invention, a method for fabricating passive components is disclosed. First, a substrate is provided. At least a connecting region, at least a capacitor region and at least an inductance region are defined in the substrate, and the substrate comprises a first metal layer and an insulating layer on the first metal layer. Subsequently, a first etching process is performed on the insulating layer so as to remove the insulating layer positioned in the connecting region, the insulating layer positioned in the inductance region and a part of the insulating layer positioned in the capacitor region, and to retain a part of the insulating layer positioned in the capacitor region. Next, a second etching process is performed on the first metal layer so as to form at least an outer connecting pad in the connecting region, a plurality of first conducting plugs in the inductance region, a bottom electrode below the insulating layer in the capacitor region and at least a second conducting plug positioned near by the bottom electrode. Furthermore, a dielectric layer is deposited on the substrate. Additionally, a patterned hard mask is formed on the dielectric layer. Next, a third etching process is performed on the dielectric layer by utilizing the patterned hard mask as an etching mask to form an inductance pattern opening in the inductance region and a top electrode opening in the capacitor region. The inductance pattern opening exposes the first conducting plugs, and the top electrode opening exposes the second conducting plug and the bottom electrode. Following that, the inductance pattern opening and the top electrode opening are filled with a second metal layer so as to form an inductance structure and a capacitor structure. Thereafter, a passive layer is deposited and a fourth etching process is next performed to expose the outer connecting pad.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a method of integrating the manufacturing processes of passive components. It can be applied for the devices, such as mixed-signal circuits, radio frequency circuits, low-noise amplifiers, voltage-controlled oscillators, or power amplifiers.

Figure 12:
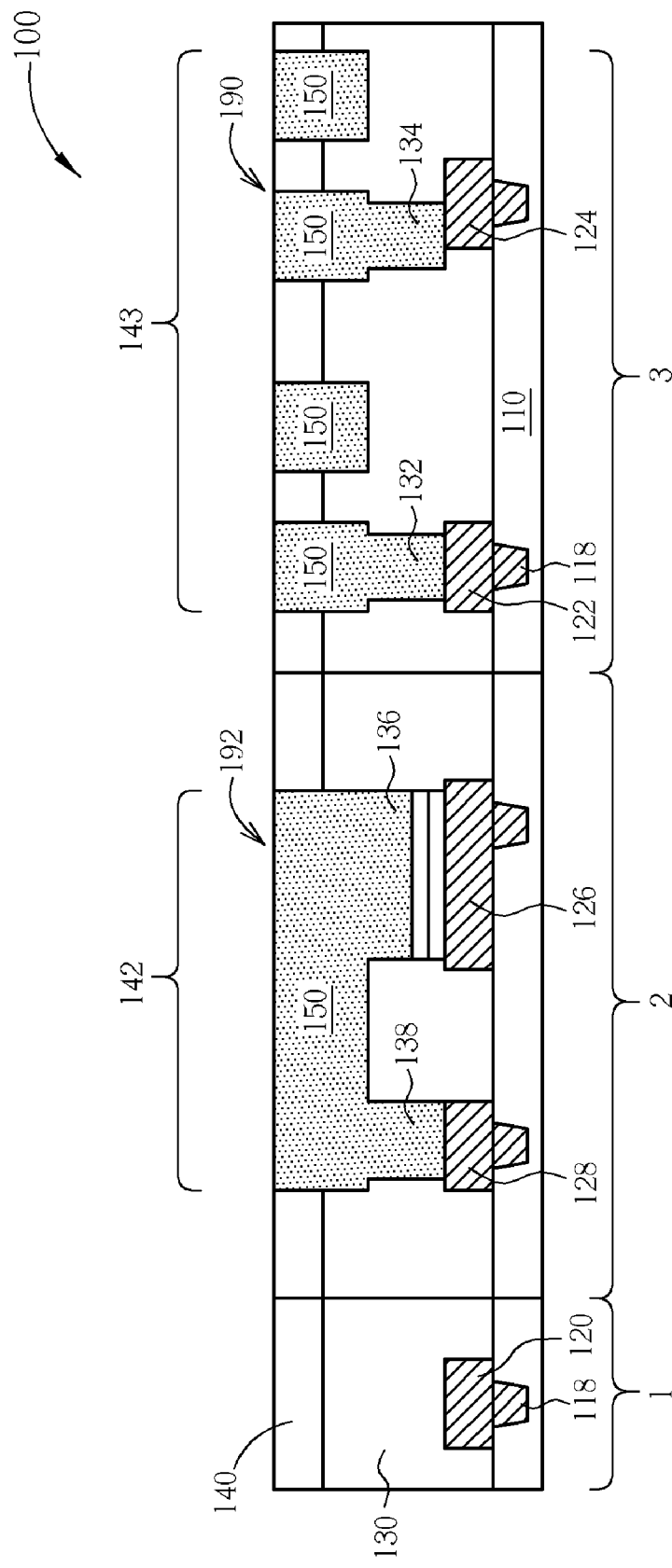
Figure 13:
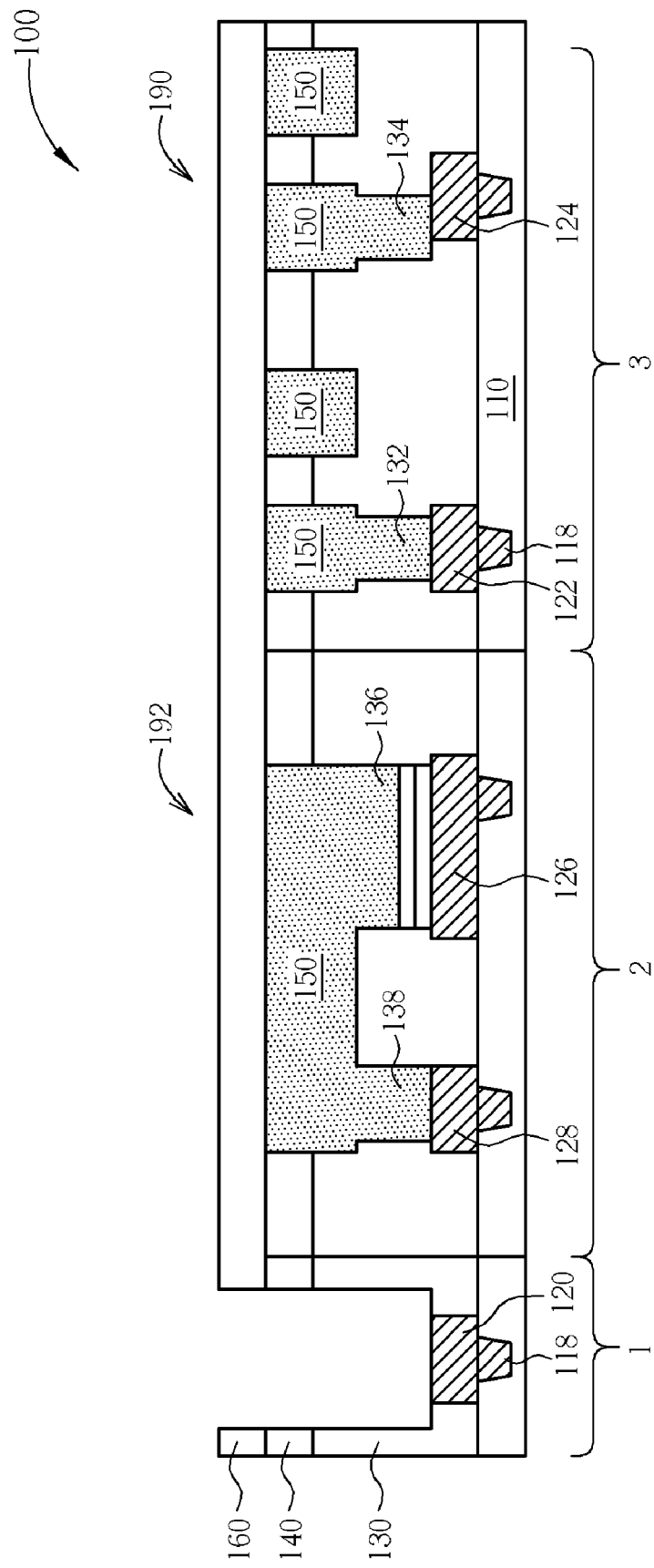
Figure 14:
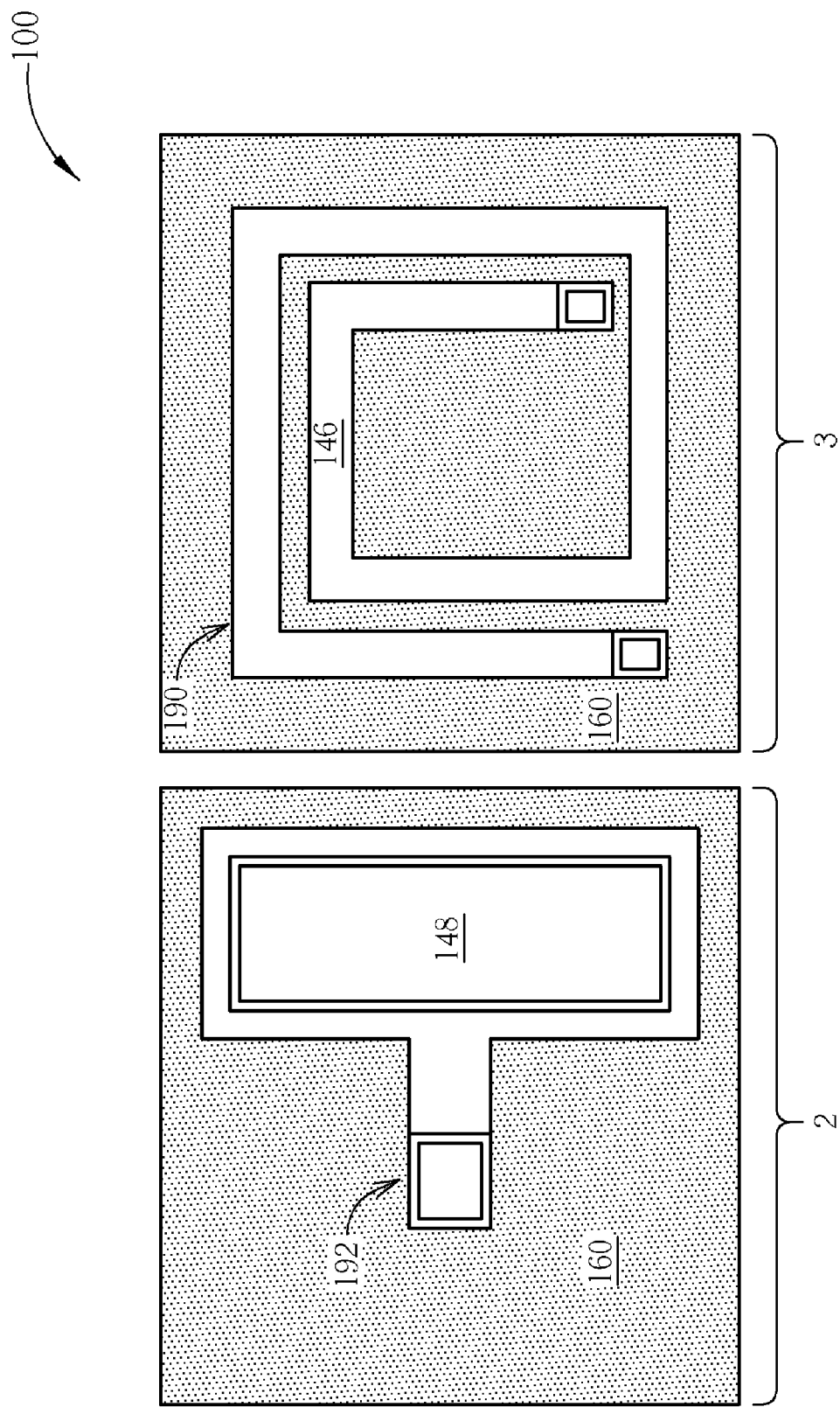
FIG. 14 is a schematic top view of the semiconductor wafer shown in FIG. 13.

Please refer to FIG. 8 through FIG. 14. FIG. 8 through FIG. 13 are schematic cross-sectional diagrams illustrating a method for manufacturing passive components in accordance with a preferred embodiment of the present invention, and FIG. 14 is a schematic top view of the semiconductor wafer 100 shown in FIG. 13, wherein like number numerals designate similar or the same parts, regions or elements. It is to be understood that the drawings are not drawn to scale and are served only for illustration purposes. In addition, some lithographic and etching processes relating to the present invention method are known in the art and thus not explicitly shown in the drawings.

Figure 1:
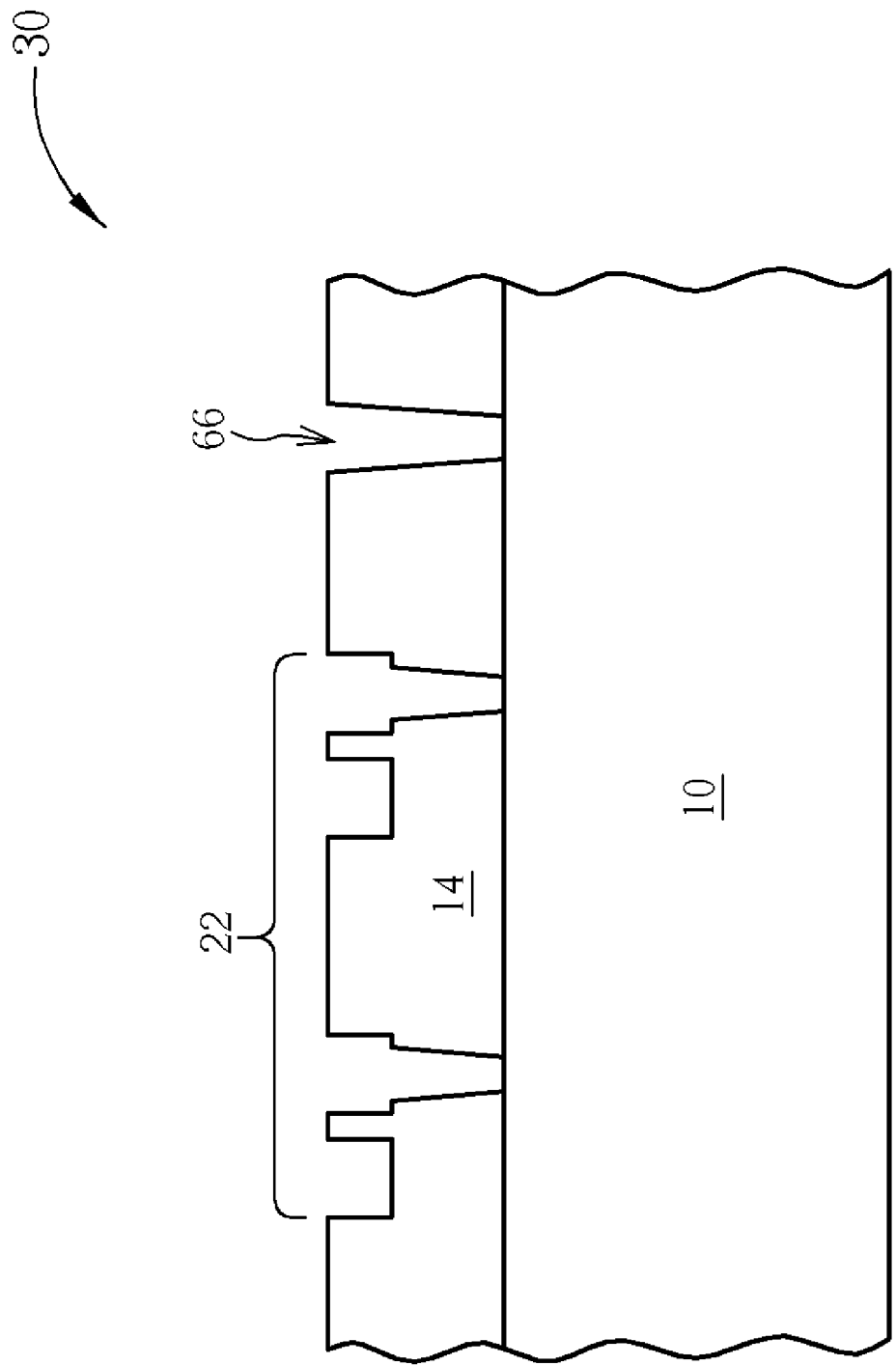
FIG. 1 through FIG. 7 are schematic diagrams illustrating a method for forming a capacitor, an inductance structure and an outer connecting pad in a semiconductor wafer according to the prior art.
Figure 2:
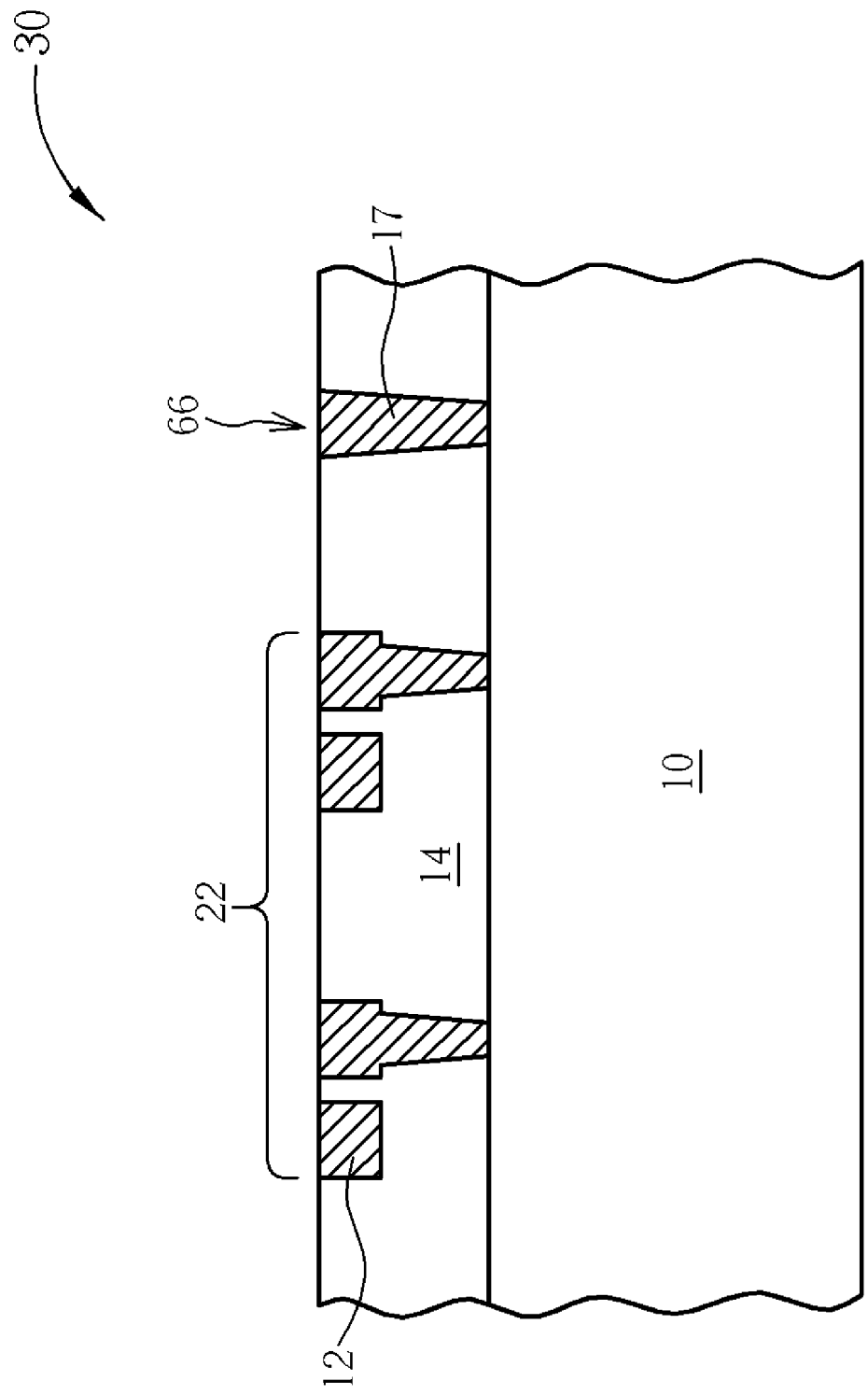
Figure 3:
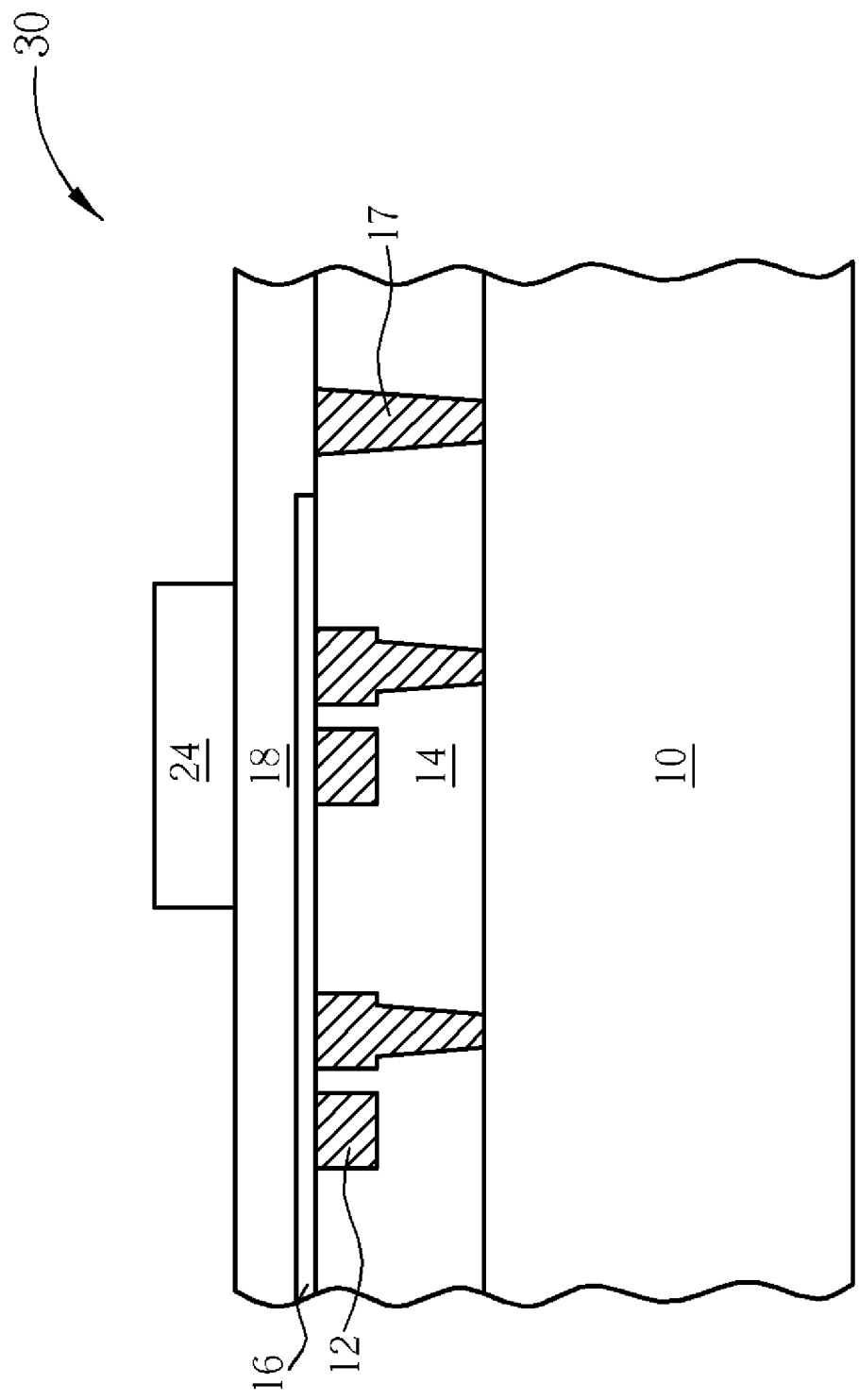
Figure 4:
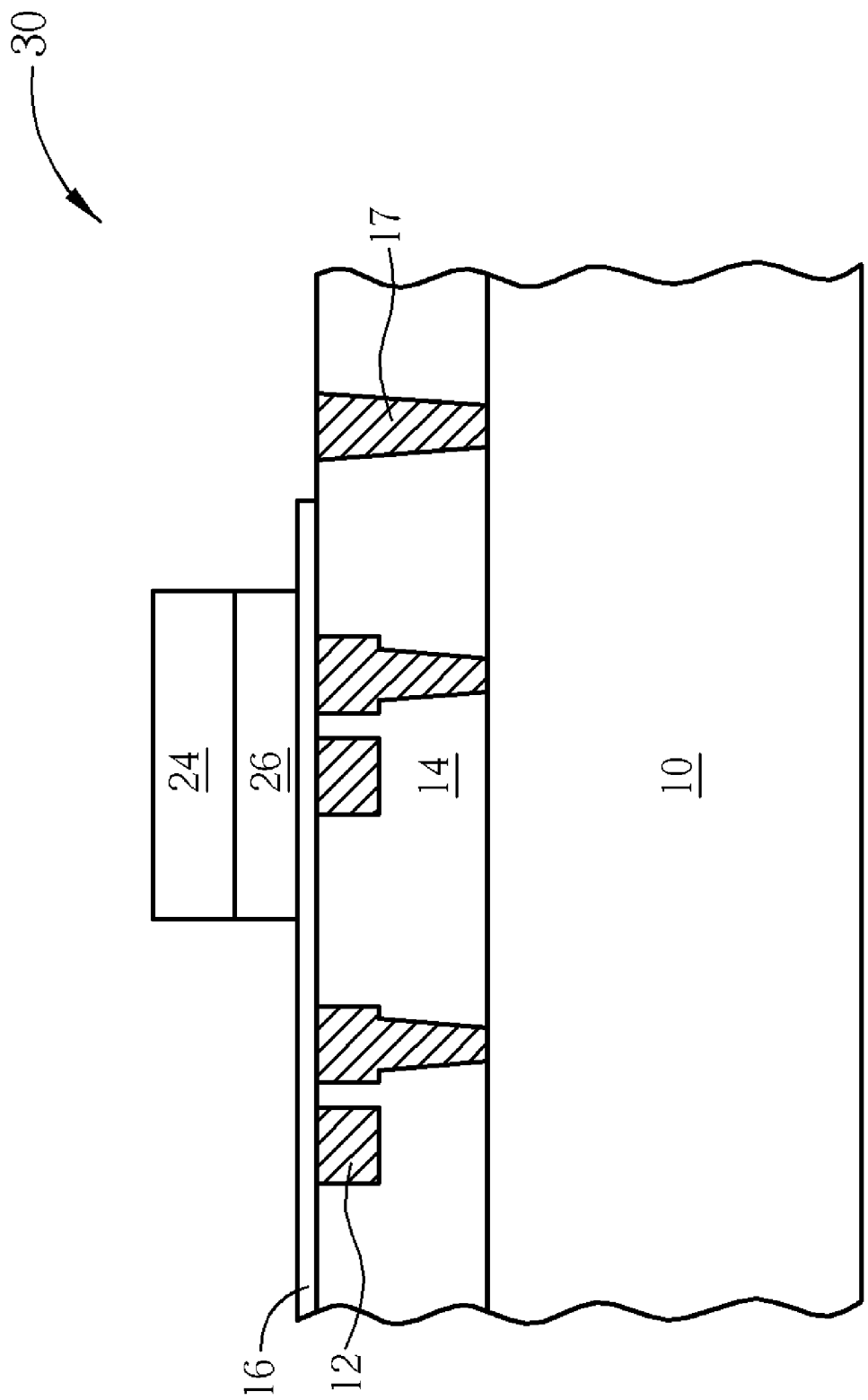
Figure 5:
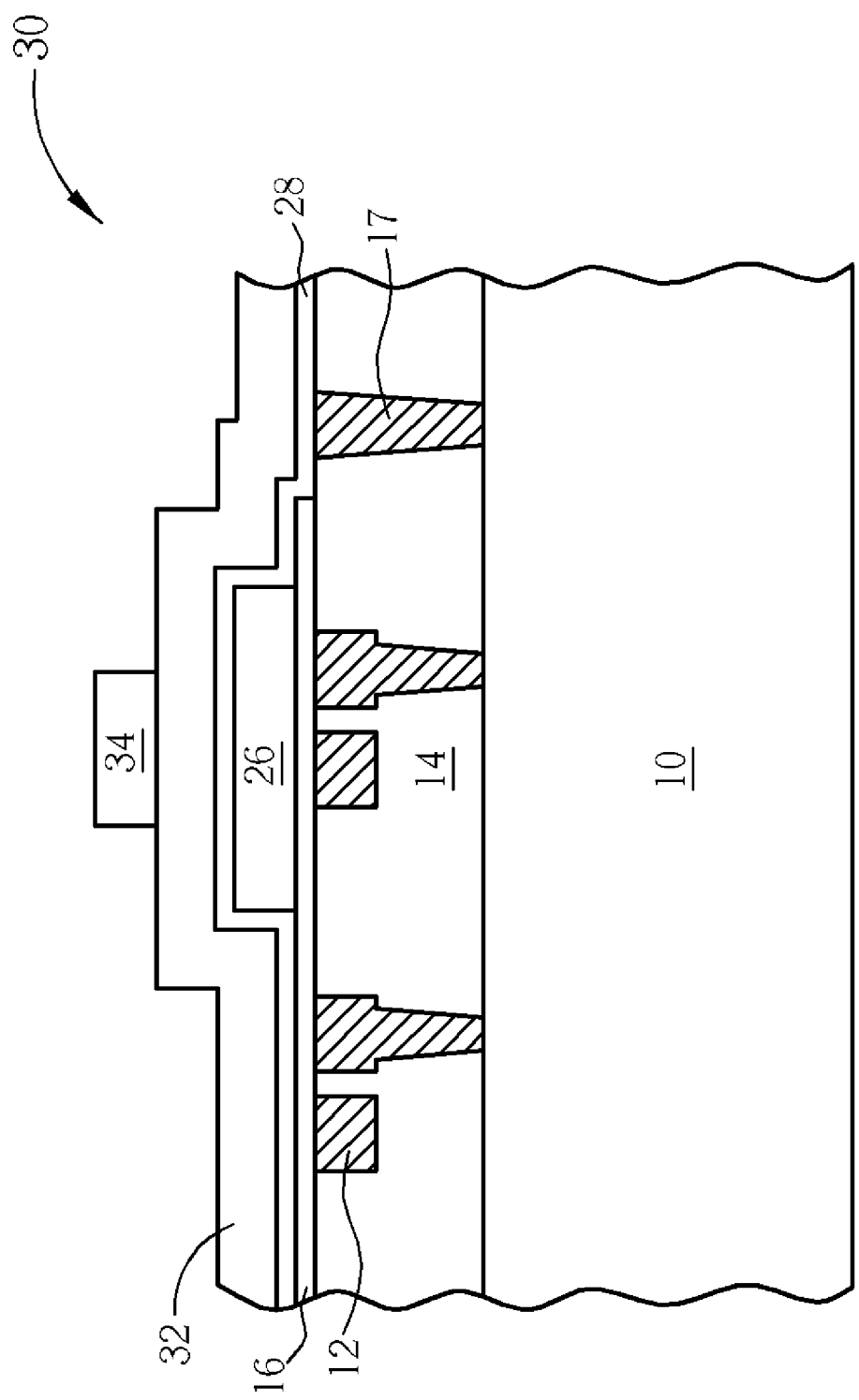
Figure 6:
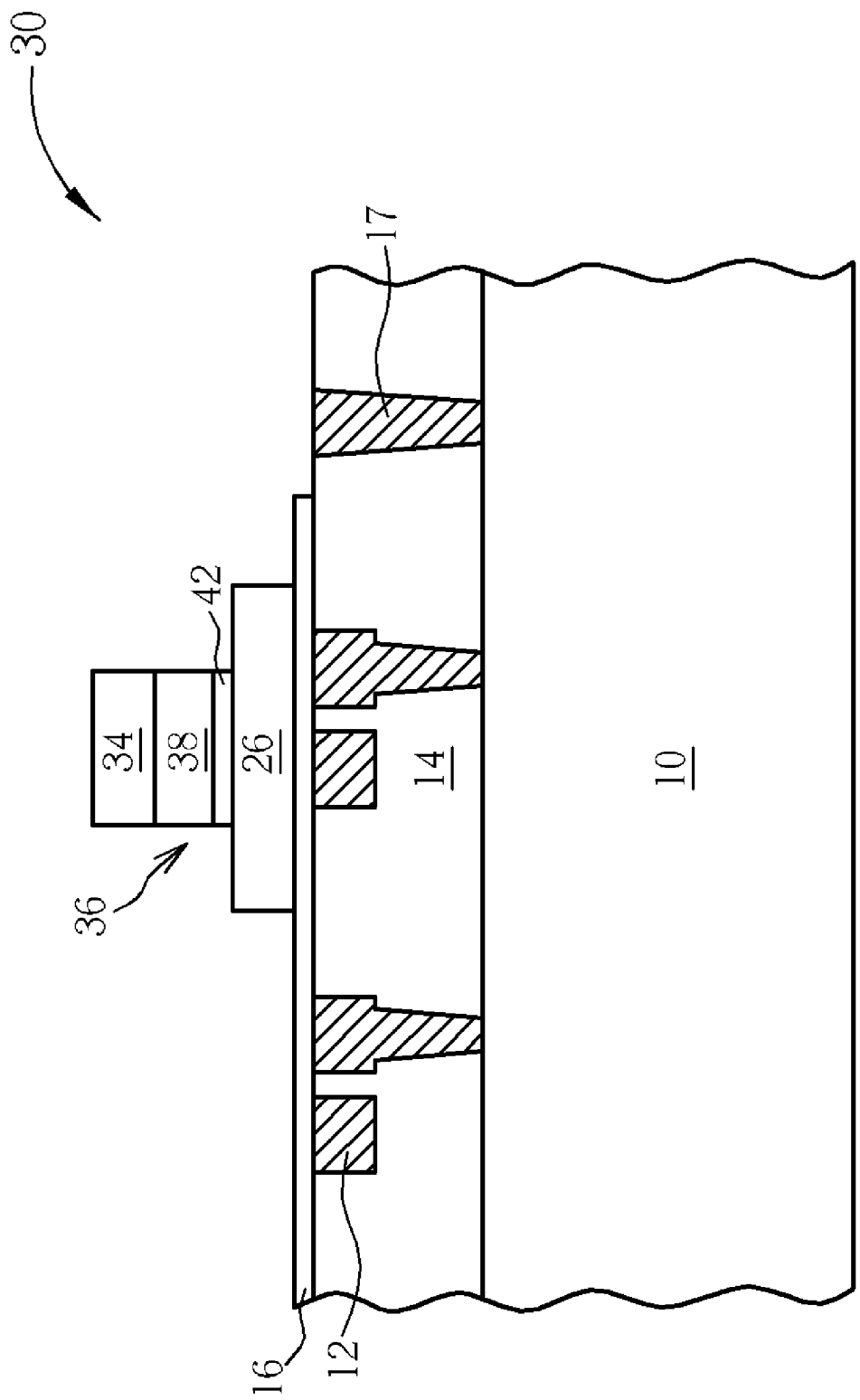
Figure 7:
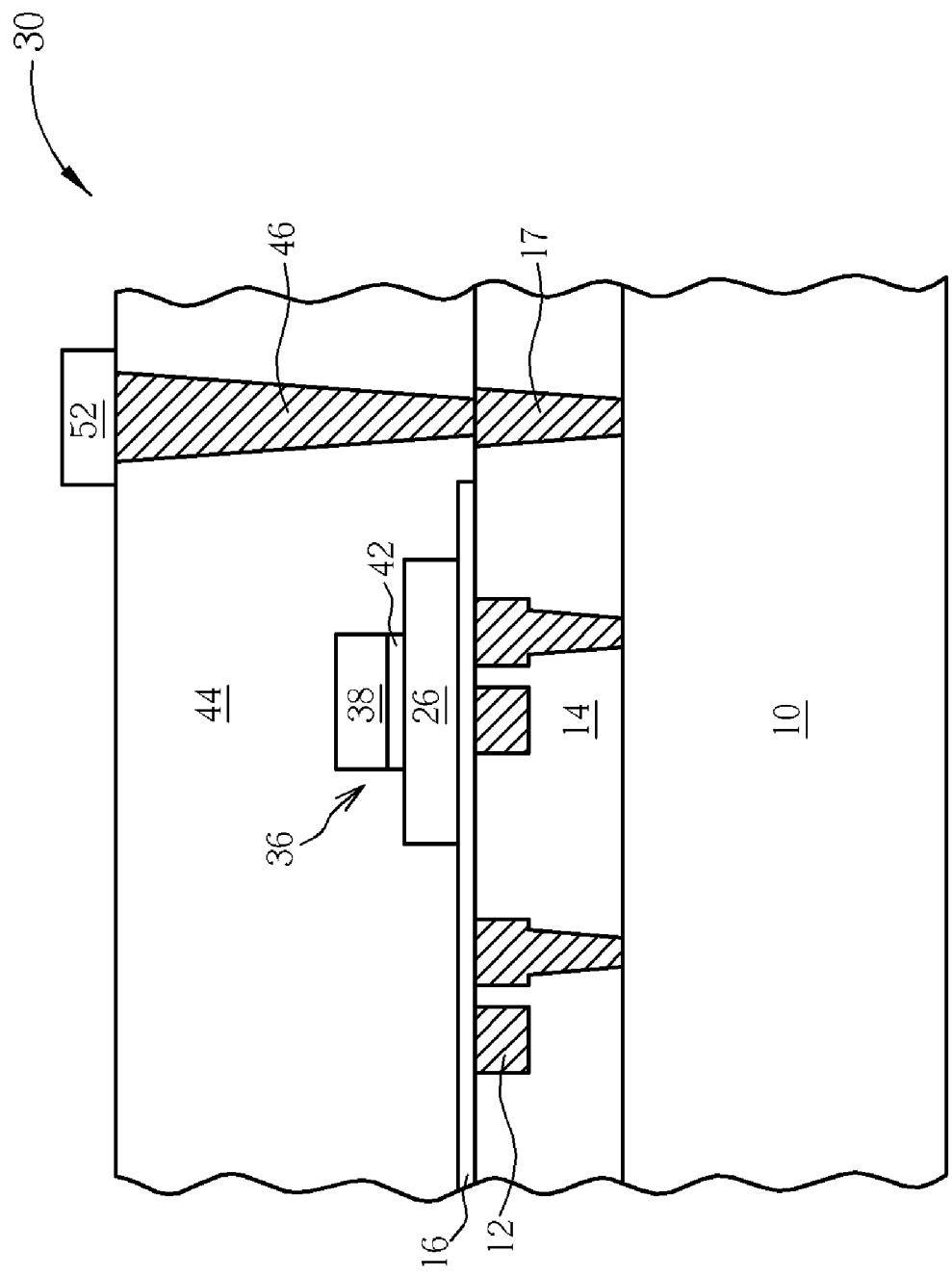
Figure 8:
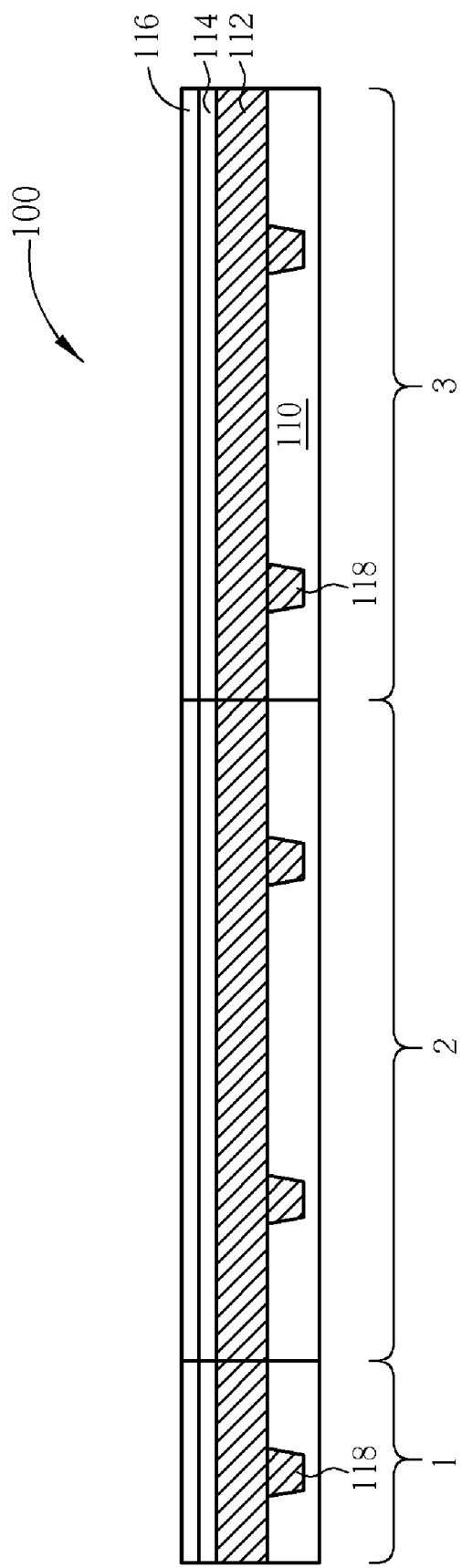
FIG. 8 through FIG. 13 are schematic cross-sectional diagrams illustrating a method for manufacturing passive components in accordance with a preferred embodiment of the present invention.

As shown in FIG. 8, a semiconductor wafer 100 is provided first. The semiconductor wafer 100 includes a substrate 110, a first metal layer 112 located on the substrate 110, and an insulating layer 114 positioned on the first metal layer 112. The substrate 110 may be a silicon substrate or a silicon-on-insulator (SOI) substrate, but is not limited thereto. At least a connecting region 1, at least a capacitor region 2 and at least an inductance region 3 are defined in the substrate 110. In the present invention, the insulating layer 114 that can include insulating materials such as oxide-nitride-oxide (ONO), alumina ($Al_2O_3$), tantalum oxide ($Ta_2O_5$), or hafnium oxide ($HfO_2$) is the dielectric layer of the MIM capacitor. In addition, the first metal layer 112 can include conductive materials, such as copper, aluminum, tungsten, or alloys of the above-mentioned metals, and the thickness of the first metal layer 112 is equal to or less than 1 micrometer. According to the preferred embodiment of the present invention, a barrier layer 116 can be deposited optionally on the surface of the insulating layer 114 for preventing the copper ion migration from the copper layer to the insulating layer 114. The barrier layer 116 can include different combinations of tantalum (Ta), tantalum nitride (TaN), titanium (Ti), and titanium nitride. It should be noted that the semiconductor wafer 100 includes an inner core circuit (the full view of the inner core circuit is not shown in the figures), which includes a plurality of transistor components, a plurality of resistance components, a plurality of interconnects 118, etc. The inner core circuit will be electrically connected to the follow-up capacitor structure, the follow-up inductance structure, the follow-up outer connecting pad and other components in the semiconductor wafer 100. However, the detailed connection of the inner core circuit should depend on the chip design, and is not described in detail here.

Figure 9:
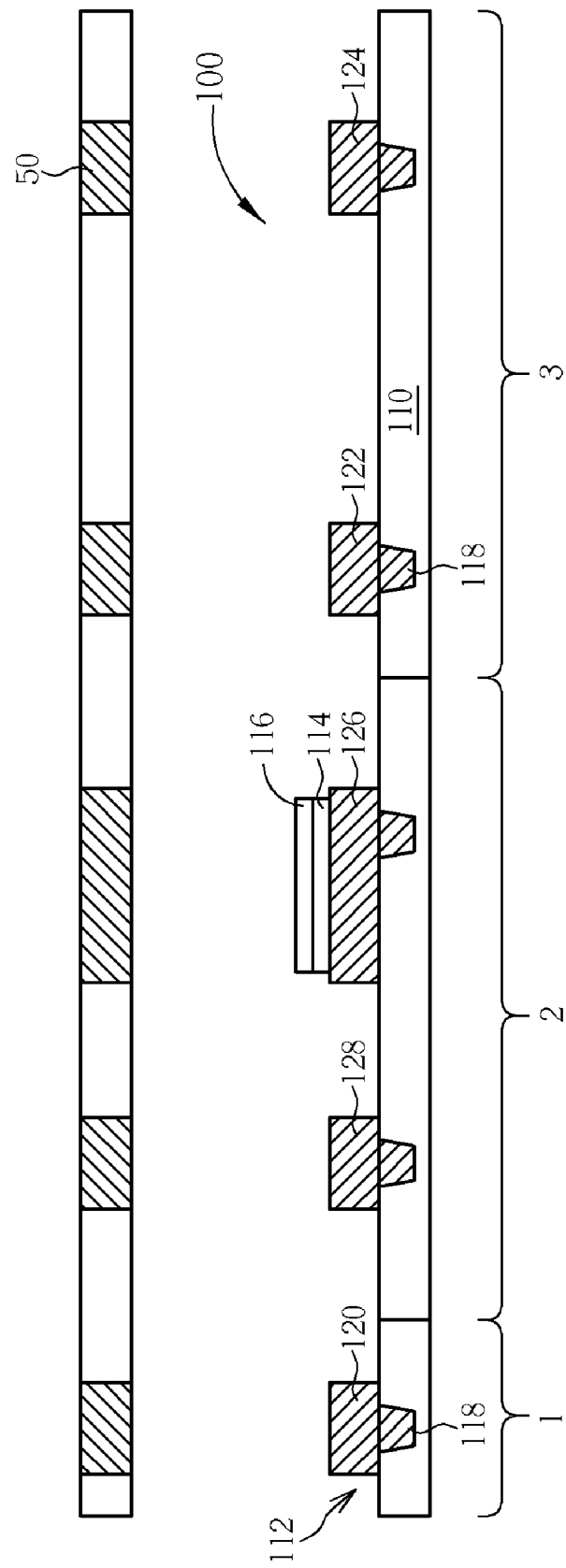

Subsequently, as shown in FIG. 9, a patterning process is performed on the barrier layer 116 and the insulating layer 114. The patterning process includes: (1) coating a photoresist layer (not shown in the figure) on the surface of the barrier layer 116; (2) performing a lithographic and etching process to transfer a pattern of a photo mask to the photoresist layer, and to transfer the pattern of the photoresist layer to the barrier layer 116 and the insulating layer 114 so that the barrier layer 116 and the insulating layer 114 positioned in the connecting region 1, the barrier layer 116 and the insulating layer 114 positioned in the inductance region 3, and parts of the barrier layer 116 and the insulating layer 114 positioned in the capacitor region 2 are removed; and (3) removing the patterned photoresist layer. As a result, parts of the barrier layer 116 and parts of the insulating layer 114 positioned in the capacitor region 2 retain.

Next, another patterning process is performed on the first metal layer 112. According to this patterning process, another photoresist layer (not shown in the figure) is coated on the surface of the semiconductor wafer 100, and another lithographic and etching process is performed to transfer a pattern of a photo mask 50 to the first metal layer 112. The etched first metal layer 112 forms at least an outer connecting pad 120 in the connecting region 1, a plurality of first conducting plugs 122, 124 in the inductance region 3, a bottom electrode 126 below the insulating layer 114 in the capacitor region 2 and at least a second conducting plug 128 positioned in the capacitor region 2. The second conducting plug 128 can be located near by the bottom electrode 126, and the outer connecting pad 120, the first conducting plugs 122, the first conducting plugs 124, the bottom electrode 126 and the second conducting plug 128 do not contact with each other.

Figure 10:
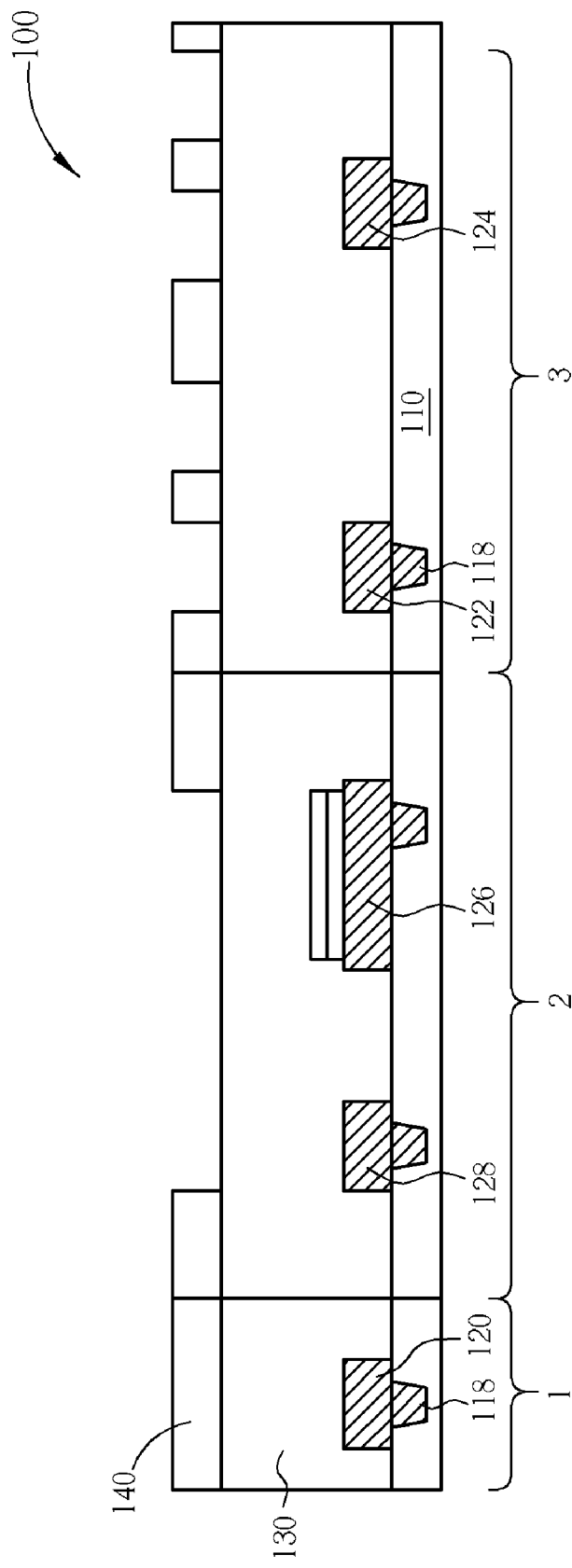

As shown in FIG. 10, a dielectric layer 130 is deposited on the whole substrate 110. The dielectric layer 130 can be formed by a chemical vapor deposition (CVD) process, and the thickness of dielectric layer 130 is equal to or less than 4 micrometers. A patterned hard mask 140 is formed on the dielectric layer 130. The patterned hard mask 140 can be a patterned photoresist layer, a patterned silicon nitride layer, a patterned silicon oxide layer, etc. It should be noticed that the thicknesses mentioned in the present invention are set for a 65 nm process. It is to be understood that all sizes in the present invention can be changed as required. In other words, as the size of the MOS transistors becomes smaller, the thicknesses of these material layers might also become thinner.

Figure 11:
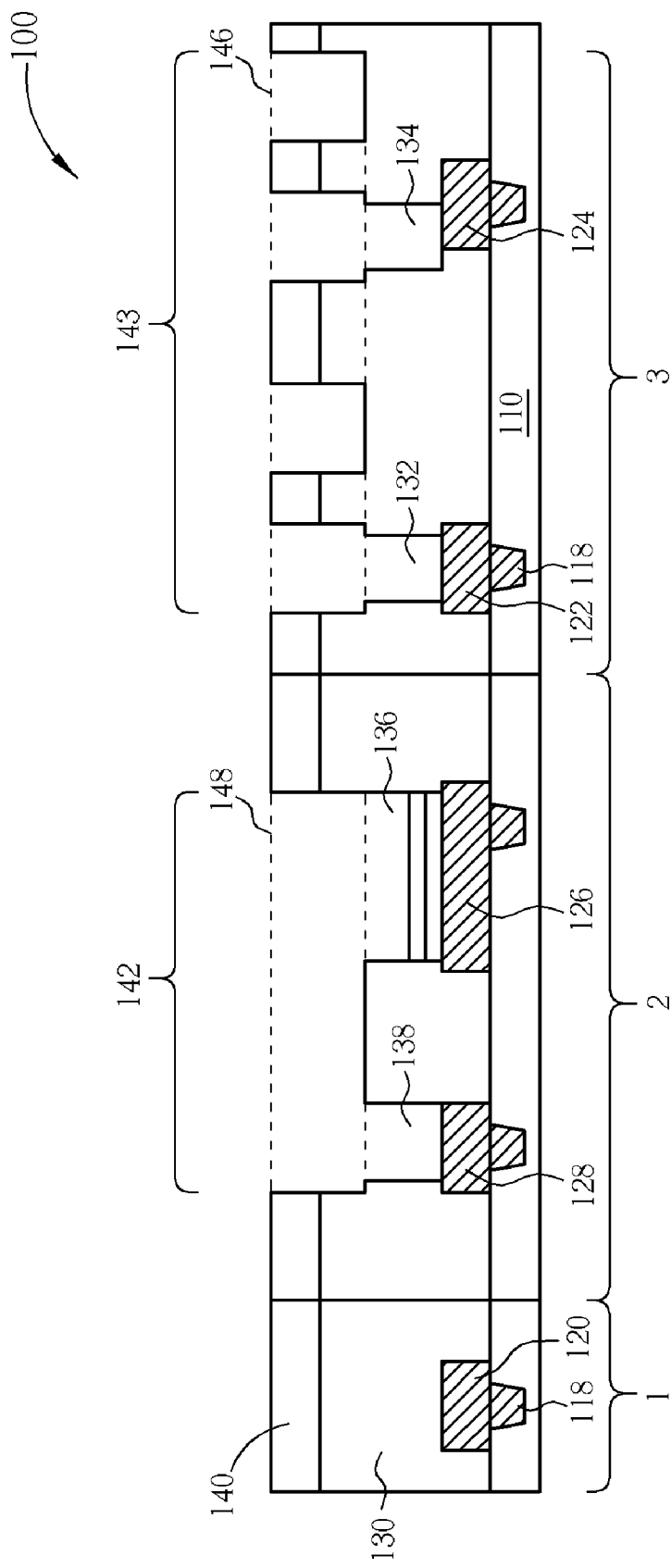

Next, as shown in FIG. 11, another etching process is performed on the dielectric layer 130 by utilizing the patterned hard mask 140 as an etching mask so as to form an inductance pattern opening 143 in the inductance region 3 and a top electrode opening 142 in the capacitor region 2. According to the preferred embodiment of the present invention, the inductance pattern opening 143 and the top electrode opening 142 are dual damascene structures. The inductance pattern opening 143 includes an inductance pattern trench 146 and at least two plug holes 132, 134, and the top electrode opening 142 includes a top electrode trench 148 and at least two plug holes 136, 138. Accordingly, the inductance pattern opening 143 exposes the first conducting plugs 122, 124, and the top electrode opening 142 exposes the second conducting plug 128 and the bottom electrode 126. Generally speaking, the inductance pattern opening 143 has a spiral layout pattern, which is constituted by the inductance pattern trench 146. However, the actual shape of the inductance pattern opening 143 depends on the circuit design, and is not limited to the figure. In this embodiment, the depths of the inductance pattern trench 146 and the top electrode trench 148 are equal to or less than 2 micrometers, one single trench width of the inductance pattern trench 146 is equal to or less than 1.5 micrometers, and the depth and the width of each plug hole are equal to or less than 1 micrometer.

It should be noted that the inductance pattern opening 143 and the top electrode opening 142 can be formed by a general dual damascene process. A general dual damascene process includes following different types of processes: (1) a via-first fabrication; (2) a self-aligned fabrication; and (3) a trench-first fabrication. For instance, a patterned hard mask 140 is formed on the dielectric layer 130 for defining the position of the inductance structure and the capacitor structure. Next, an anisotropic etching process is performed on the dielectric layer 130 so as to form an inductance pattern trench 146 in the inductance region 3 and a top electrode trench 148 in the capacitor region 2. The inductance pattern trench 146 is positioned above the first conducting plugs 122 and 124, and the top electrode trench 148 is positioned above the second conducting plug 128 and the bottom electrode 126. Next, a photoresist pattern layer (not shown) is formed in the inductance pattern trench 146 and the top electrode trench 148, and thereafter another anisotropic etching process is performed on the dielectric layer 130 so as to form at least four plug holes 132, 134, 136, and 138. The plug holes 132, 134 electrically connect the first conducting plugs 122, 124 with the inductance pattern trench 146, the plug hole 138 electrically connects the second conducting plug 128 with the top electrode trench 148, and another plug hole 136 electrically connects the bottom electrode 126 with the top electrode trench 148.

Furthermore, the manufacturing method of the inductance pattern opening 143 and the top electrode opening 142 is not limited to the above-mentioned processes, and the inductance pattern opening 143 and the top electrode opening 142 can be formed by other means. First, the positions of at least four plug holes 132, 134, 136, and 138 are defined by a photoresist pattern layer (not shown), and are thereafter formed in the dielectric layer 130. Next, another photoresist pattern layer (not shown) is formed on the dielectric layer 130 for defining the position of t the inductance pattern trench 146 and the top electrode trench 148. Thereafter, the inductance pattern trench 146 and the top electrode trench 148 are formed in the dielectric layer 130.

As shown in FIG. 12, a second metal layer 150 is thereafter formed to fill the inductance pattern opening 143 and the top electrode opening 142 by means of deposition process or electroplating process. A chemical mechanic polishing process is next performed on the second metal layer 150 by utilizing the patterned hard mask 140 as an etching stop layer so as to form an inductance structure 190 and a capacitor structure 192. The etching processes for the inductance pattern opening 143 and the top electrode opening 142, the filling process of the second metal layer 150, and the polishing process for the second metal layer 150 can be named as a damascene process.

It is to be understood by a person skilled in this art that the second metal layer 150 can any materials having great conductance. Take copper as an example, a barrier layer (not shown) is deposited on the surface of the dielectric layer 130, and in the inductance pattern opening 143 and the top electrode opening 142 for preventing the copper ion migration from the second metal layer 150 to the dielectric layer 130. The barrier layer can include different combinations of tantalum, tantalum nitride, titanium, and titanium nitride. Next, a seed layer (not shown) is deposited on the barrier layer for enhancing the attaching ability of the copper ion of the second metal layer 150 on the dielectric layer 130. In most cases, both the barrier layer and the seed layer are formed by chemical vapor deposition processed. Thereafter, a second metal layer 150 is deposited on the surface of the dielectric layer 130, and to fill the inductance pattern opening 143 and the top electrode opening 142.

It is worthy of note that the substrate 110 and the dielectric layer 130 include a plurality of interconnects 118 (the full view of the interconnects 118 is not shown in the figures). The interconnects 118 are electrically connected to the outer connecting pad 120, the bottom electrode 126, the second conducting plug 128 and the first conducting plugs 122, 124 so as to electrically connect these components with the inner core circuit.

As shown in FIG. 13 and FIG. 14, a passivation layer 160 is thereafter formed on the substrate 110. The passivation layer 160 covers the patterned hard mask 140 and the second metal layer 150, and exposes the outer connecting pad 120. The method of forming the passivation layer 160 involves using an atmospheric chemical vapor deposition or a plasma enhanced chemical vapor deposition process to deposit a passivation layer 160 made of phosphosilicate glass over the surface of the semiconductor wafer 100 to protect the integrated circuits in the semiconductor wafer 100. Next, another etching process is performed to remove a part of the passivation layer 160 positioned above the outer connecting pad 120, a part of the patterned hard mask 140 positioned above the outer connecting pad 120, and a part of the dielectric layer 130 positioned above the outer connecting pad 120 so as to expose the outer connecting pad 120. Accordingly, once the dicing process is completed, the integrated circuit of the semiconductor wafer 100 can be electrically connected to the external device, such as packaging substrates or printed circuit broad through the outer connecting pad 120 by means of wire bonding or flip-chip bonding.

It is worthy of note that the patterned hard mask 140 not only functions as an etching mask to form an inductance pattern opening 143 and a top electrode opening 142, but also functions as an etching stop layer in the polishing process of the second metal layer 150, and as a passivation layer of the semiconductor wafer 100.

Different from the prior art method of forming the passive components, the present invention provides a method of integrating the manufacturing processes of the outer connecting pad, the inductance structure and a metal-insulator-metal capacitor. In addition, the outer connecting pad and the bottom electrode of the capacitor structure can be formed in one metal process, and the inductance structure and the top electrode of the capacitor structure can be thereafter formed in another metal process. As a result, the complex manufacturing processes of passive components can be simplified, and the method is suitable to manufacture the capacitor structure and the inductance structure that have fine structures on the aluminum layer. Accordingly, the top electrode and the bottom electrode of the capacitor can have lower resistances, and the present invention can improve the quality factor of the capacitor.

On other hand, the outer connecting pad, the inductance structure and the capacitor structure can be fabricated in the meantime on the inner core circuit of the semiconductor wafer by utilizing the aluminum process and the copper process that have been developed well. The above-mentioned embodiment takes the aluminum outer connecting pad, the aluminum bottom electrode, the copper top electrode and the copper inductance structure as examples to illustrate the present invention. However, it should be understood by a person skilled in this art that the materials of the metal layer and the order of the metal materials should not be limited to the embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing passive components, comprising:

providing a substrate, at least a connecting region, at least a capacitor region and at least an inductance region being defined in the substrate, the substrate comprising a first metal layer and an insulating layer on the first metal layer;

performing a first patterning process on the insulating layer so as to remove the insulating layer positioned in the connecting region, the insulating layer positioned in the inductance region and a part of the insulating layer positioned in the capacitor region, and to retain a part of the insulating layer positioned in the capacitor region on the unpatterned first metal layer;

performing a second patterning process on the first metal layer so as to form at least an outer connecting pad in the connecting region and to form a bottom electrode below the insulating layer positioned in the capacitor region after patterning the insulating layer;

depositing a dielectric layer on the substrate in the capacitor region, the inductance region and the connecting region to cover the outer connecting pad;

performing a third patterning process on the dielectric layer so as to form an inductance pattern opening in the inductance region, to form a top electrode opening in the capacitor region above the bottom electrode, and to retain a part of the dielectric layer covering the outer connecting pad;

filling the inductance pattern opening and the top electrode opening of the remaining dielectric layer with a second metal layer so as to form an inductance structure and a top electrode in the remaining dielectric layer, the top electrode and the bottom electrode forming a capacitor structure; and performing a fourth patterning process on the remaining dielectric layer to expose the outer connecting pad.

2. The method of claim 1, wherein the substrate comprises a plurality of interconnects, and the interconnects are electrically connected to the outer connecting pad, the bottom electrode, the top electrode and the inductance structure.

3. The method of claim 1 further comprising a step of forming a passivation layer on the substrate before the step of performing the fourth patterning process.

4. The method of claim 3, wherein the fourth patterning process removes a part of the passivation layer positioned above the outer connecting pad, and removes a part of the dielectric layer positioned above the outer connecting pad.

5. The method of claim 1, wherein the first metal layer comprises aluminum.

6. The method of claim 1, wherein the second metal layer comprises copper.

7. The method of claim 1, wherein the inductance pattern opening comprises a spiral layout pattern.

8. The method of claim 1, wherein the insulating layer comprises an oxide-nitride-oxide structure (ONO structure).

9. The method of claim 1, wherein the substrate further comprises barrier layer positioned on a surface of the insulating layer.

10. A method for manufacturing passive components, comprising:

providing a substrate, at least a connecting region, at least a capacitor region and at least an inductance region being defined in the substrate, the substrate comprising a first metal layer and an insulating layer on the first metal layer;

performing a first patterning process on the insulating layer so as to remove the insulating layer positioned in the connecting region, the insulating layer positioned in the inductance region and a part of the insulating layer positioned in the capacitor region, and to retain a part of the insulating layer positioned in the capacitor region on the unpatterned first metal layer;

performing a second patterning process on the first metal layer so as to form at least an outer connecting pad in the connecting region, a plurality of first conducting plugs in the inductance region, at least a second conducting plug in the capacitor region and a bottom electrode below the insulating layer in the capacitor region after patterning the insulating layer;

depositing a dielectric layer on the substrate in the capacitor region, the inductance region and the connecting region to cover the outer connecting pad;

performing a third patterning process on the dielectric layer so as to form an inductance pattern opening in the inductance region and a top electrode opening in the capacitor region, the inductance pattern opening exposing the first conducting plugs, the top electrode opening exposing the second conducting plug and the insulating layer, the remaining dielectric layer covering the outer connecting pad;

filling the inductance pattern opening and the top electrode opening of the remaining dielectric layer with a second metal layer so as to form an inductance structure and a capacitor structure in the remaining dielectric layer; and performing a fourth patterning process on the remaining dielectric layer to expose the outer connecting pad.

11. The method of claim 10, wherein the inductance pattern opening comprises an inductance pattern trench and a plurality of plug holes.

12. The method of claim 10, wherein the top electrode opening comprises a top electrode trench and a plurality of plug holes.

13. The method of claim 10, wherein the third patterning process comprises:

performing a fifth patterning process on the dielectric layer so as to form an inductance pattern trench in the inductance region and a top electrode trench in the capacitor region, the inductance pattern trench positioned above the first conducting plugs, the top electrode trench positioned above the second conducting plug and the bottom electrode; and performing a sixth patterning process on the dielectric layer so as to form a plurality of plug holes, the plug holes electrically connecting the first conducting plugs with the inductance pattern trench, the second conducting plug with the top electrode trench, and the bottom electrode with the top electrode trench.

14. The method of claim 10, wherein the substrate comprises a plurality of interconnects, and the interconnects are electrically connected to the outer connecting pad, the bottom electrode, the second conducting plug and the first conducting plugs.

15. The method of claim 10 further comprising a step of forming a passivation layer on the substrate before the step of performing the fourth patterning process.

16. The method of claim 15, wherein the fourth patterning process removes a part of the passivation layer positioned above the outer connecting pad, and removes a part of the dielectric layer positioned above the outer connecting pad.

17. A method for manufacturing passive components, comprising:

providing a substrate, at least a connecting region, at least a capacitor region and at least an inductance region being defined in the substrate, the substrate comprising a first metal layer and an insulating layer on the first metal layer;

performing a first patterning process on the insulating layer so as to remove the insulating layer positioned in the connecting region, the insulating layer positioned in the inductance region and a part of the insulating layer positioned in the capacitor region, and to retain a part of the insulating layer positioned in the capacitor region on the unpatterned first metal layer;

performing a second patterning process on the first metal layer so as to form at least an outer connecting pad in the connecting region, a plurality of first conducting plugs in the inductance region, a bottom electrode below the insulating layer in the capacitor region and at least a second conducting plug positioned near by the bottom electrode after patterning the insulating layer;

depositing a dielectric layer on the substrate in the capacitor region, the inductance region and the connecting region to cover the outer connecting pad;

forming a patterned hard mask on the dielectric layer;

performing a third patterning process on the dielectric layer by utilizing the patterned hard mask as a mask to form an inductance pattern opening in the inductance region and a top electrode opening in the capacitor region, the inductance pattern opening exposing the first conducting plugs, the top electrode opening exposing the second conducting plug and the insulating layer, the remaining dielectric layer covering the outer connecting pad;

filling the inductance pattern opening and the top electrode opening of the remaining dielectric layer with a second metal layer so as to form an inductance structure and a capacitor structure in the remaining dielectric layer; and performing a fourth patterning process on the remaining dielectric layer to expose the outer connecting pad.

18. The method of claim 17 farther comprising a polishing process after the step of filling the inductance pattern opening and the top electrode opening, wherein the polishing process polishes the second metal layer by utilizing the patterned hard mask as a stop layer.

19. The method of claim 17 farther comprising a step of forming a passivation layer on the substrate, wherein the passivation layer covers the patterned hard mask and the second metal layer, and exposes the outer connecting pad.

20. The method of claim 19, wherein the fourth patterning process removes a part of the passivation layer positioned above the outer connecting pad, a part of the patterned hard mask positioned above the outer connecting pad, and a part of the dielectric layer positioned above the outer connecting pad.

21. The method of claim 17, wherein the first metal layer comprises aluminum.

22. The method of claim 17, wherein the inductance pattern opening comprises a dual damascene structure.

23. The method of claim 17, wherein the top electrode opening comprises a dual damascene structure.

24. The method of claim 17, wherein the insulating layer comprises an oxide-nitride-oxide structure.

* * * * *